United States Patent [19]

Komatsu et al.

[11] 4,224,088

[45] Sep. 23, 1980

[54] METHOD FOR MANUFACTURING A SEMICONDUCTOR DEVICE

[75] Inventors: Shigeru Komatsu, Yokohama; Hiroshi Inoue, Tokyo, both of Japan

[73] Assignee: Tokyo Shibaura Denki Kabushiki Kaisha, Japan

[21] Appl. No.: 954,325

[22] Filed: Oct. 24, 1978

[30] Foreign Application Priority Data

Oct. 26, 1977 [JP] Japan .................................. 52-127566

[51] Int. Cl.² ............................................ H01L 21/22
[52] U.S. Cl. ................................. 148/187; 148/188; 148/189; 148/1.5
[58] Field of Search ................. 148/188, 189, 1.5, 187

[56] References Cited

U.S. PATENT DOCUMENTS

| 3,566,218 | 2/1971 | Widlar | 148/186 X |
| 3,879,230 | 4/1975 | Nakamura et al. | 148/1.5 |
| 4,069,067 | 1/1978 | Ichinohe | 148/1.5 |
| 4,144,106 | 3/1979 | Tokeuchi | 148/187 |
| 4,146,413 | 3/1979 | Yonezawa et al. | 148/188 X |

Primary Examiner—G. Ozaki
Attorney, Agent, or Firm—Finnegan, Henderson, Farabow, Garrett & Dunner

[57] ABSTRACT

A method for manufacturing steps of depositing phosphorus onto separate portions of a silicon substrate, covering only one portion with a polycrystalline silicon layer and heating the deposited phosphorus on the separate portions at the same time to diffuse thereby forming two diffusion layers of different depths.

5 Claims, 7 Drawing Figures

METHOD FOR MANUFACTURING A SEMICONDUCTOR DEVICE

BACKGROUND OF THE INVENTION

This invention relates to a method for manufacturing a semiconductor device employing a silicon substrate, more particularly a semiconductor device provided with at least two semiconductor elements of substantially the same type which vary from each other in electrical characteristics.

Heretofore, it has hardly been possible to form in the same step these two semiconductor elements, that is, as semiconductor elements transistors having substantially equal emitter top area and different electrical characteristics, with the current amplification factors $\beta$ of these transistors varying from each other, e.g., $\beta=200$ and $\beta=100$. In order to form such type of integrated circuit, therefore, the depths xj of the base regions of the two elements may be varied from each other in the base region forming step, or otherwise two kinds of impurities with different diffusion coefficients may be used in the emitter region forming step, whereby the manufacturing process will be complicated. Moreover, in the former case, the base region depth of a transistor with higher current amplification factor $\beta$ need be controlled to be shallower than that of one with lower current amplification factor $\beta$, so that the base regions of the two transistors must usually be formed in a separate base region forming step. In addition, if the base regions are formed in two steps, the impurities in the base region formed in the former step may be rediffused at the base diffusion in the latter process, so that it is very difficult to control the depth of the latter base region. Also in the latter case, the introduction of the different impurities requires two steps, and the control of the diffusion depth is difficult.

SUMMARY OF THE INVENTION

Accordingly, the object of this invention is to provide a method for manufacturing a semiconductor device, including simple manufacturing processes and capable of easily controlling the depth of the regions of semiconductor elements, whereby a semiconductor device with at least two semiconductor elements of substantially the same type having different electrical characteristics can be manufactured with ease and high accuracy.

DETAILED DESCRIPTION OF THE PREFERRED EMBODIMENT

Now there will be described the method for manufacturing a semiconductor device according to an embodiment of this invention with reference to the accompanying drawings.

Two p-type base regions 11 and 12 are formed on one side of a phosphorus-doped silicon substrate 10 with a specific resistance of 1 to 1.5 $\Omega$cm by a known method. Although these base regions, in this embodiment, are simultaneously formed by vapor diffusion of boron with boron nitride as an impurity source, also available are other known methods, such as diffusion of impurity from a silicon oxide film doped with p-type impurity, and ion implantation.

Figure 1A:
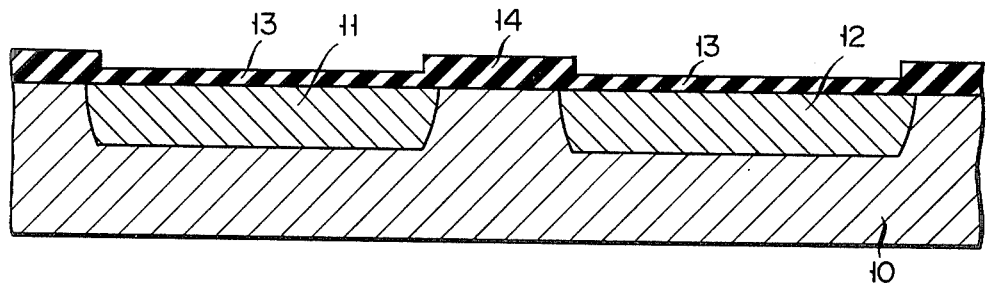
FIGS. 1A to 1F are views for illustrating the method for manufacturing a semiconductor device according to an embodiment of this invention.

As shown in FIG. 1A, a silicon dioxide film 14 is formed on the silicon substrate 10 as a diffusion mask for the impurity for the formation of the base regions 11 and 12. Further, an insulating layer 13 of silicon dioxide is formed on the base regions 11 and 12. These silicon dioxide films 13 and 14 may be formed by the known thermal oxidation method or low-temperature pyrolysis of silane.

Figure 1B:
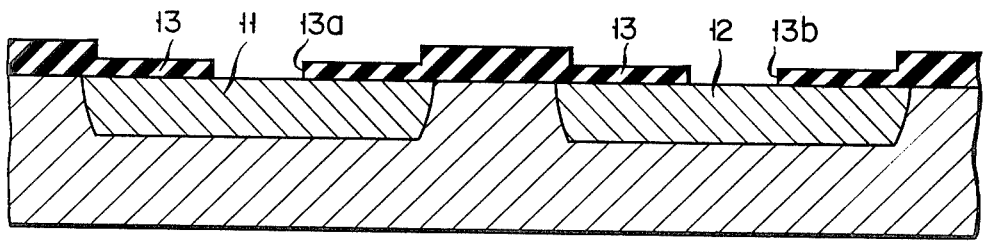

Then, as shown in FIG. 1B, the parts of the silicon dioxide film 13 on the two base regions 11 and 12 are removed by selective etching to form openings 13a and 13b, thereby exposing part of those base regions.

Figure 1C:
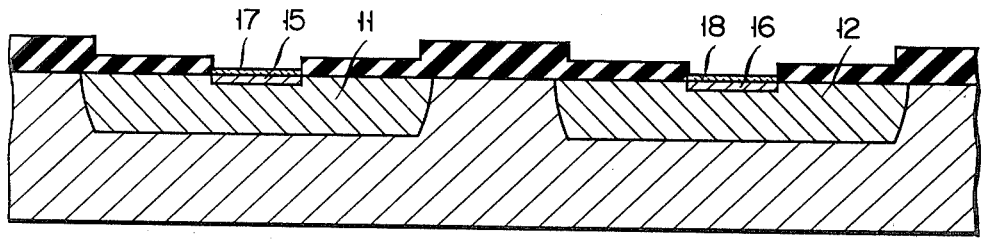

Subsequently, phosphorus oxychloride is decomposed in an oxidizing atmosphere at 950° C., so that phosphorus is deposited on the exposed surfaces of the base regions 11 and 12 to form high-impurity n-type regions 15 and 16 to a little depth of 0.1$\mu$, for example, as shown in FIG. 1C. Phosphorus glass films 17 and 18, which are then formed on the n-type regions 15 and 16 respectively, are removed by etching with dilute hydrofluoric acid, as illustrated.

Figure 1D:
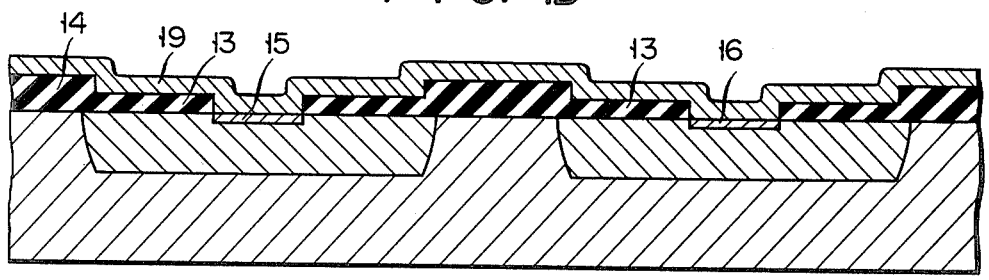

Thereafter, as shown in FIG. 1D, a polycrystalline silicon layer 19 is formed to a thickness of e.g. 3,000 Å on the silicon dioxide films 13 and 14 and on the n-type regions 15 and 16. This polycrystalline silicon layer 19 may be formed by pyrolysis of silane ($SiH_4$) through high-frequency heating at a temperature of 650° C. The specific resistance of the polycrystalline silicon layer 19 may be reduced by doping in the layer 19 an n-type impurity with a diffusion constant smaller than that of phosphorus, such as arsenic. Available for the arsenic doping is a method in which $AsH_3$ and $SiH_4$ are pyrolyzed by high-frequency heating.

Figure 1E:
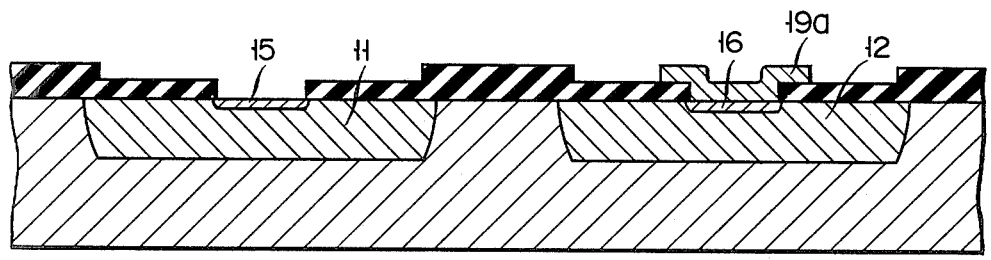

Then, the polycrystalline silicon layer 19 is removed by the selective etching method except a portion 19a on and around the n-type region 16, as shown in FIG. 1E. While one n-type region 16 is entirely covered with the remaining portion 19a, the other n-type region 15 is exposed.

Figure 1F:
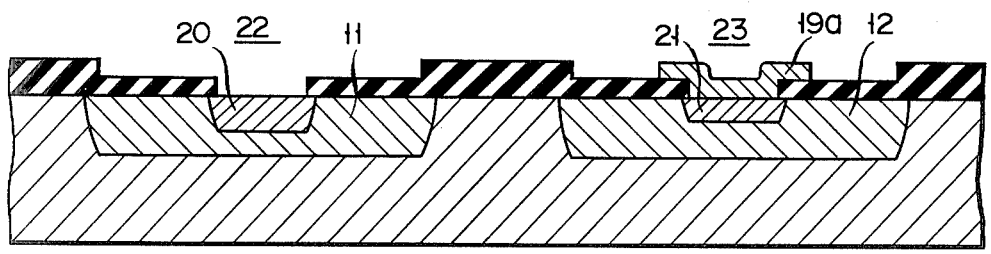

The resultant structure is heated in dry oxygen or oxygen-nitrogen atmosphere at 950° C. for 40 minutes, and phosphorus within the n-type regions 15 and 16 is diffused into the base regions 11 and 12, whereby n-type emitter regions 20 and 21 are formed as shown in FIG. 1F. As may be seen from FIG. 1F, these emitter regions 20 and 21 are so formed that the one region 20 that is disposed is deeper as compared with the other region 21 that is covered with the polycrystalline silicon layer 19a. This is so because phosphorus in the one n-type region 16 is diffused substantially equally into the base region 12 and the polycrystalline silicon layer 19a, whereas phosphorus in the other n-type region 15 is diffused practically solely to the base region 11.

An emitter electrode and a base electrode are formed on each emitter region and base region by a conventional method, and thus a first planar transistor 22 with narrower base and a second planar transistor 23 with wider base are formed, whereby a semiconductor integrated circuit is completed.

In the device formed as aforesaid, the current amplification factor $\beta$ and collector-emitter withstand voltage $V_{CEO}$ of the first transistor are approximately 200 and 20 V respectively, while those of the second transistor are approximately 100 and 28 V. These electrical characteristics may be set at desired levels by controlling the same diffusing conditions as those of ordinary impurity diffusion.

Figure 2:
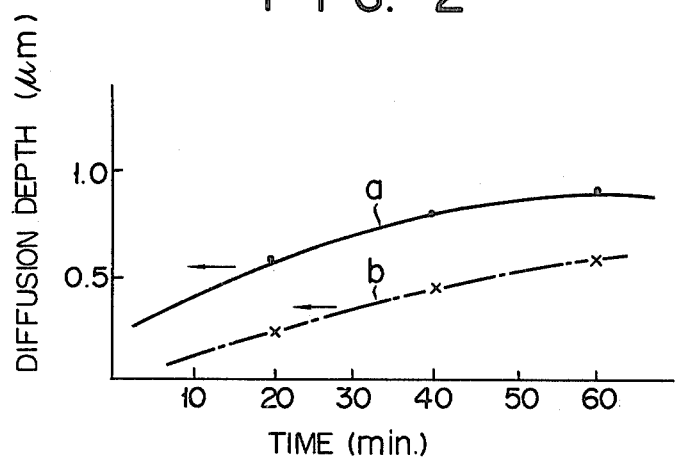
FIG. 2 shows the relation between the diffusion depth of the emitter region of each transistor of the semiconductor device and the diffusion time.

FIG. 2 shows the relation between the diffusion depths of the first and second emitter regions with varied heating times, according to the aforementioned manufacturing processes. In this figure, the heating time (minute) and diffusion depth xj ($\mu$m) are plotted on the abscissa and ordinate respectively, curves a and b representing the respective diffusion depths of the first and second emitter regions. It may be seen from FIG. 2 that the diffusion depth xj of one region (second emitter region) covered with the polycrystalline silicon layer is always smaller than that of the other independently of the heating or diffusion time, and that the ratio between these two diffusion depths may be controlled by the diffusion time.

Naturally, the diffusion depth may be controlled also by the kind and quantity of the impurity with which the polycrystalline silicon layer is previously doped.

Although in the above-mentioned embodiment the deposition of phosphorus is achieved by decomposing phosphorus oxychloride, it may be done by any other method in which phosphorus may be stuck at a temperature to prohibit phosphorus from diffusing, such as introduction of phosphorus ion by ion implantation. Further, the planar transistor, which is used as the semiconductor element for the above embodiment, may be replaced by any other type of element, such as diode, resistor capacitor, junction FET, etc.

According to the method of this invention, as described above, diffusion layers with varied diffusion depths may easily be formed by only diffusing phosphorus, which has previously been deposited separately on two portions on a silicon body, into the silicon body after forming a polycrystalline silicon layer on one of the two portions. Moreover, both the diffusion depths can easily be controlled with high accuracy.

What we claim is:

1. A method for manufacturing a semiconductor device comprising a first step for preparing a silicon body, a second step for forming first and second n-type regions by depositing phosphorus separately on two portions on said body, a third step for forming a polycrystalline silicon layer on said first n-type region, and a fourth step for heating to diffuse phosphorus within said first and second n-type regions, to form a shallow first diffused region and a deep second diffused region separately in said body.

2. A method according to claim 1, wherein said third step is a process for forming a polycrystalline silicon layer doped with an n-type impurity with a diffusion coefficient smaller than that of phosphorus.

3. A method according to claim 1 or 2, wherein said first step includes preparing an n-type silicon substrate and forming first and second p-type base regions on one side of said substrate, said two base regions being separated from each other, and said second step includes depositing phosphorus separately on portions on said first and second base regions.

4. A method according to claim 3, wherein said second step is a process for depositing phosphorus by decomposing phosphorus oxychloride.

5. A method according to claim 3, wherein said second step is a process for depositing phosphorus ions by ion implantation.

* * * * *